United States Patent
Fujisaki et al.

(10) Patent No.: US 10,541,105 B2
(45) Date of Patent: Jan. 21, 2020

(54) MULTI CHARGED PARTICLE BEAM WRITING APPARATUS AND ADJUSTING METHOD FOR MULTI CHARGED PARTICLE BEAM WRITING APPARATUS

(71) Applicant: NuFlare Technology, Inc., Yokohama-shi (JP)

(72) Inventors: Eita Fujisaki, Yokohama (JP); Yukitaka Shimizu, Yokohama (JP)

(73) Assignee: NuFlare Technology, Inc., Yokohama-shi (JP)

( * ) Notice: Subject to any disclaimer, the term of this patent is extended or adjusted under 35 U.S.C. 154(b) by 0 days.

(21) Appl. No.: 15/839,984

(22) Filed: Dec. 13, 2017

(65) Prior Publication Data
US 2018/0247788 A1 Aug. 30, 2018

(30) Foreign Application Priority Data
Feb. 24, 2017 (JP) ................................ 2017-033439

(51) Int. Cl.
*H01J 37/20* (2006.01)
*H01J 37/147* (2006.01)
(Continued)

(52) U.S. Cl.
CPC ........ *H01J 37/1471* (2013.01); *H01J 37/045* (2013.01); *H01J 37/20* (2013.01);
(Continued)

(58) Field of Classification Search
USPC .................................................... 250/492.3
See application file for complete search history.

(56) References Cited

U.S. PATENT DOCUMENTS

| 3,894,271 A * | 7/1975 | Pfeiffer ............... H01J 37/1471 219/121.25 |
| 5,703,492 A * | 12/1997 | Nakamura ....... G01R 31/31912 250/207 |

(Continued)

FOREIGN PATENT DOCUMENTS

| JP | 2001-202912 | 7/2001 |
| JP | 2005-302359 | 10/2005 |

(Continued)

OTHER PUBLICATIONS

Taiwanese Office Action dated Feb. 21, 2019 in Taiwanese Patent Application No. 107102310 (with English translation), 8 pages.
(Continued)

*Primary Examiner* — Phillip A Johnston
(74) *Attorney, Agent, or Firm* — Oblon, McClelland, Maier & Neustadt, L.L.P.

(57) ABSTRACT

In one embodiment, a multi charged particle beam writing apparatus includes an emitter emitting a charged particle beam, a shaping aperture array forming multiple beams by allowing the charged particle beam to pass through a plurality of opening portions, an alignment unit disposed between the emitter and the shaping aperture array, the alignment unit including an aperture plate, a detector provided in the aperture plate and detecting charged particles, and an alignment coil adjusting an angle of incidence of the charged particle beam on the aperture plate, a feature quantity calculating unit calculating, from an alignment scan image based on a detection value of the detector, a feature quantity representing a perpendicularity of the angle of incidence of the charged particle beam on the aperture plate, and a coil control unit controlling an excitation value of the alignment coil based on the feature quantity.

4 Claims, 5 Drawing Sheets

(51) Int. Cl.
*H01J 37/04* (2006.01)
*H01J 37/302* (2006.01)
*H01J 37/317* (2006.01)

(52) U.S. Cl.
CPC ...... *H01J 37/3026* (2013.01); *H01J 37/3177* (2013.01); *H01J 2237/0435* (2013.01)

(56) References Cited

U.S. PATENT DOCUMENTS

| | | | | |
|---|---|---|---|---|
| 7,378,668 | B2* | 5/2008 | Tanimoto | B82Y 10/00 250/207 |
| 7,915,582 | B2* | 3/2011 | Hirose | H01J 37/21 250/306 |
| 9,569,836 | B2* | 2/2017 | Hirai | G01N 23/2254 |
| 10,042,261 | B2* | 8/2018 | Nanao | G03F 7/2059 |

FOREIGN PATENT DOCUMENTS

| | | |
|---|---|---|
| JP | 2006-287013 | 10/2006 |
| JP | 2007-012306 A | 1/2007 |
| JP | 2007-324174 | 12/2007 |
| JP | 2012-104426 | 5/2012 |
| JP | 2013-251225 | 12/2013 |
| JP | 2015-153630 | 8/2015 |

OTHER PUBLICATIONS

Office Action issued in corresponding Korean Application No. 10-2018-0021151 dated Sep. 16, 2019 (with English translation).

* cited by examiner

MULTI CHARGED PARTICLE BEAM WRITING APPARATUS AND ADJUSTING METHOD FOR MULTI CHARGED PARTICLE BEAM WRITING APPARATUS

CROSS REFERENCE TO RELATED APPLICATION

This application is based upon and claims benefit of priority from the Japanese Patent Application No. 2017-33439, filed on Feb. 24, 2017, the entire contents of which are incorporated herein by reference.

FIELD

The present invention relates to a multi charged particle beam writing apparatus and an adjusting method for multi charged particle beam writing apparatus.

BACKGROUND

The increasing integration of LSIs has led to finer and finer circuit line widths of semiconductor devices. An approach employed to form desired circuit patterns on semiconductor devices uses a step-and-repeat exposure system to reduce and transfer, onto a wafer, a high-precision master pattern (also called a mask, or a reticle particularly when used in a stepper or scanner) formed on a piece of quartz. The high-precision original pattern is written with an electron beam writing apparatus by use of a so-called electron beam lithography technique.

For example, there are writing apparatuses that use multiple beams. Using multiple beams can significantly improve throughput, because more beams than in the case of writing with a single electron beam can be applied at the same time (i.e., in a single shot). For example, a multi-beam writing apparatus allows an electron beam emitted from an electron gun to pass through a shaping aperture array having a plurality of holes to form multiple beams, each of which is blanking-controlled by a blanking aperture array. Then, beams that have not been blocked are reduced by an optical system and applied to a substrate on a movable stage.

The electron gun and the shaping aperture array are provided with an alignment mechanism therebetween, which includes an alignment coil and an aperture member and adjusts the optical axis of the electron beam. After the optical axis is adjusted by the alignment coil, the electron beam passes through the aperture member and illuminates the shaping aperture array. The shaping aperture array has a plurality of holes arranged in a matrix with a predetermined array pitch. Multiple beams are formed by allowing the electron beam to pass through the plurality of holes of the shaping aperture array. A beam array (multiple beams) applied to the substrate ideally has a pitch that is obtained by multiplying the array pitch of the plurality of holes of the shaping aperture array by a desired reduction ratio.

In the adjustment of the optical axis of the electron beam carried out by the alignment mechanism, it is particularly important to adjust the angle of incidence such that the electron beam is perpendicularly incident on the aperture member. If the angle of incidence is not well adjusted, the beam array applied to the substrate is partially lost. This affects the measurement and evaluation of the beam shape, and interferes with improvement in writing accuracy.

DETAILED DESCRIPTION

A multi charged particle beam writing apparatus includes an emitter emitting a charged particle beam, a shaping aperture array including a plurality of opening portions and forming multiple beams by allowing the charged particle beam to pass through the plurality of opening portions, a blanking aperture array including a plurality of blankers each configured to perform blanking deflection of a corresponding beam of the multiple beams, a stage holding a substrate thereon, the substrate being irradiated with the multiple beams, an alignment unit disposed between the emitter and the shaping aperture array, the alignment unit including an aperture plate, a detector provided in the aperture plate and detecting charged particles, and an alignment coil adjusting an angle of incidence of the charged particle beam on the aperture plate, a feature quantity calculating unit calculating, from an alignment scan image based on a detection value of the detector, a feature quantity representing a perpendicularity of the angle of incidence of the charged particle beam on the aperture plate, and a coil control unit controlling an excitation value of the alignment coil based on the feature quantity.

Hereinafter, an embodiment of the present invention will be described based on the drawings.

Figure 1:
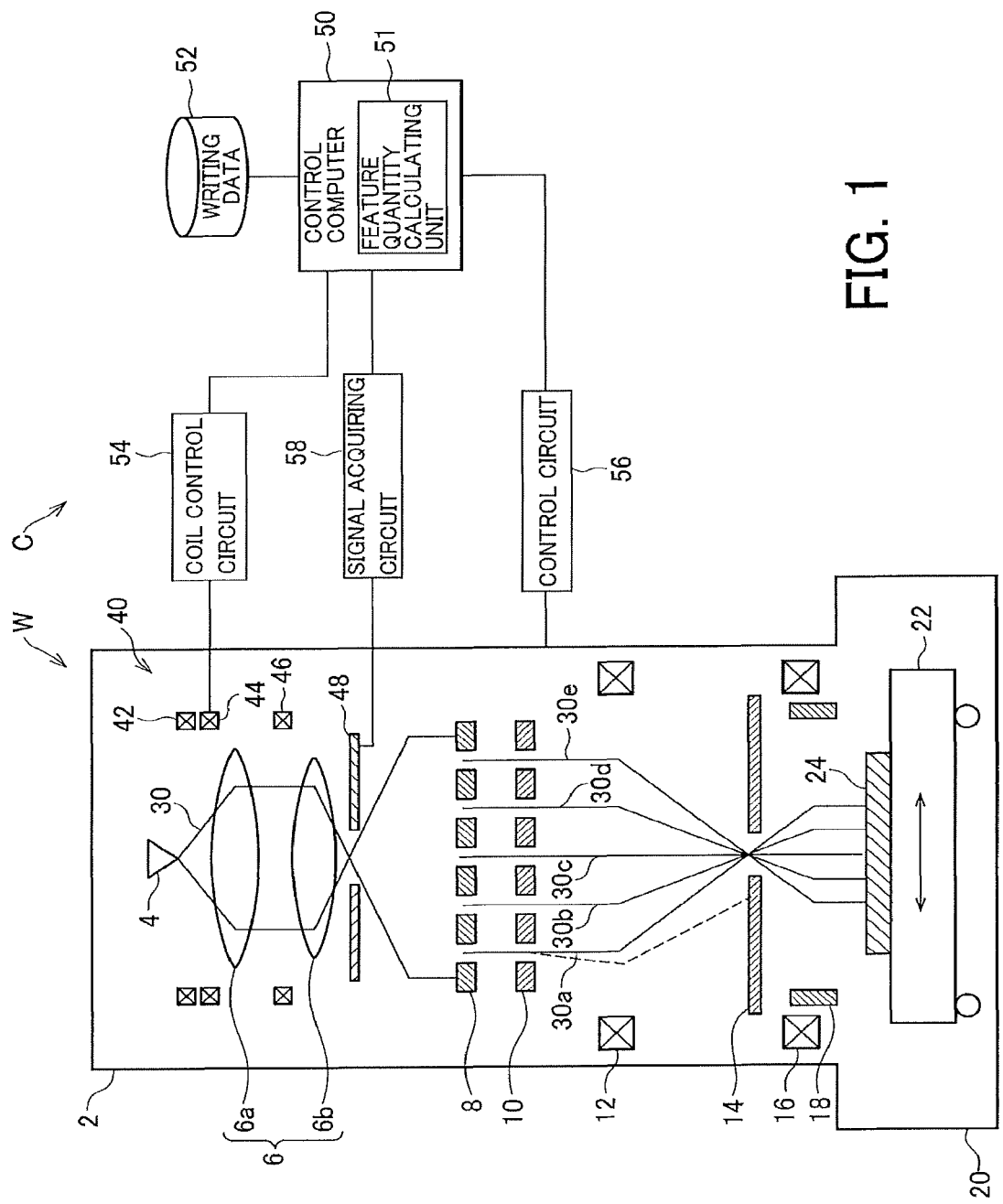
FIG. 1 is a schematic view of a multi charged particle beam writing apparatus according to an embodiment of the present invention.

FIG. 1 is a schematic view of a multi charged particle beam writing apparatus according to an embodiment of the present invention. The present embodiment describes a configuration in which electron beams are used as charged particle beams. Note that the charged particle beams are not limited to electron beams, and may be of other types, such as ion beams.

The writing apparatus includes a writer W that applies electron beams to a substrate 24, which serves as a writing target, to write a desired pattern thereon, and a controller C that controls the operation of the writer W.

The writer W includes an electron beam barrel 2 and a writing chamber 20. The electron beam barrel 2 includes therein an electron gun 4, an illuminating lens system 6, a shaping aperture array 8, a blanking aperture array 10, a reducing lens 12, a limiting aperture member 14 (limiting aperture plate), an objective lens 16, a deflector 18, and an alignment mechanism (alignment unit) 40.

The illuminating lens system 6 includes electron lenses 6a and 6b. In the direction of travel of an electron beam 30 emitted from the electron gun 4, the electron lens 6b is disposed after (or downstream of) the electron lens 6a.

The alignment mechanism 40 is disposed between the electron gun 4 and the shaping aperture array 8. The alignment mechanism 40 includes alignment coils 42, 44, and 46 and an aperture member 48 (aperture plate) having a circular hole in the center thereof.

The alignment coil 42 adjusts the position of incidence of the electron beam 30 on the electron lens 6a. The alignment coil 44 adjusts the angle of incidence of the electron beam 30 on the aperture member 48. The alignment coil 46 adjusts the position of incidence of the electron beam 30 on the aperture member 48.

The aperture member 48 is provided with a detector that detects electrons (beam current) blocked by the aperture member 48 without passing through the hole in the center of the aperture member 48.

An XY stage 22 is disposed in the writing chamber 20. The substrate 24 (writing target) is placed on the XY stage 22. Examples of the substrate 24 (writing target) include a wafer, and an exposure mask for transferring a pattern to a wafer using a step-and-repeat exposure system or extreme ultraviolet (EUV) exposure system, such as a stepper or scanner, which uses an excimer laser as a light source.

Figure 2:
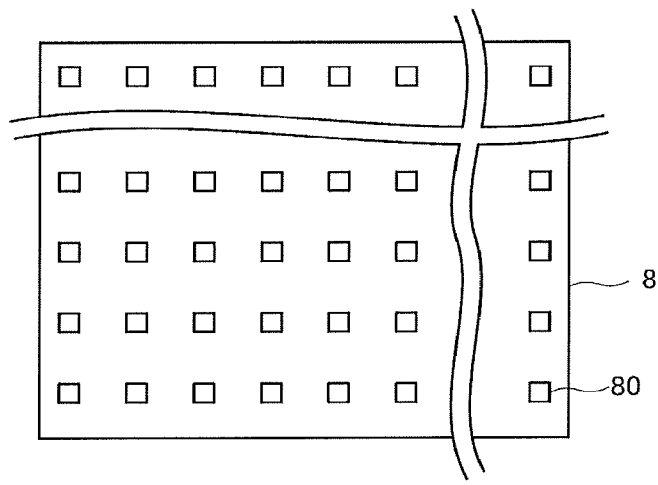
FIG. 2 is a schematic view of a shaping aperture array.

The optical axis of the electron beam 30 emitted from the electron gun 4 (emitter) is adjusted by the alignment mechanism 40. The electron beam 30 then passes through the aperture member 48 and substantially perpendicularly illuminates the shaping aperture array 8. FIG. 2 is a conceptual diagram illustrating a configuration of the shaping aperture array 8. The shaping aperture array 8 has holes (opening portions) 80 arranged in a matrix of m columns (in the y direction) and n rows (in the x direction) with a predetermined array pitch, where both m and n are greater than or equal to 2 (m, n≥2). The holes 80 are rectangular or circular holes of the same size and shape.

The electron beam 30 illuminates a region including all the holes 80 of the shaping aperture array 8. Multiple beams 30a to 30e illustrated in FIG. 1 are formed by allowing parts of the electron beam 30 to pass through the respective holes 80.

The holes 80 do not necessarily need to be arranged in a grid of rows and columns as in FIG. 2. For example, holes adjacent in the column direction may be arranged in a staggered manner.

The blanking aperture array 10 has through holes arranged to coincide with the respective holes 80 of the shaping aperture array 8, and each of the through holes is provided with a blanker composed of two electrodes forming a pair. The electron beams 30a to 30e passing through the respective through holes are independently deflected by voltages applied thereto by the corresponding blankers. Each beam is thus blanking-controlled by the deflection. The blanking aperture array 10 performs blanking deflection of each beam of the multiple beams passed through the holes 80 of the shaping aperture array 8.

The multiple beams 30a to 30e passed through the blanking aperture array 10 are reduced in beam size and array pitch by the reducing lens 12, and travel toward a center hole of the limiting aperture member 14.

Electron beams deflected by the blankers of the blanking aperture array 10 change their paths, deviate from the center hole of the limiting aperture member 14, and are blocked by the limiting aperture member 14. On the other hand, electron beams that are not deflected by the blankers of the blanking aperture array 10 pass through the hole of the limiting aperture member 14.

The limiting aperture member 14 blocks each electron beam that has been deflected by the corresponding electrodes of the blanking aperture array 10 such that the beam is turned off. Beams that have passed through the limiting aperture member 14 after being turned on and before being turned off serve as beams of one shot.

The multiple beams 30a to 30e passed through the limiting aperture member 14 are converged by the objective lens 16 to form a pattern image with a desired reduction ratio. The beams (all the multiple beams) passed through the limiting aperture member 14 are deflected together in the same direction by the deflector 18 and applied to the substrate 24.

The multiple beams applied at a time are ideally arranged with a pitch that is obtained by multiplying the array pitch of the holes 80 of the shaping aperture array 8 by the desired reduction ratio described above. When the writing apparatus performs a writing operation with a raster scanning technique, which involves continuous and sequential application of shot beams, to write a desired pattern, beams that are required to form the pattern are controlled to be turned on by blanking control. During continuous movement of the XY stage 22, the beam irradiation position is controlled by the deflector 18 to follow the movement of the XY stage 22.

The controller C includes a control computer 50, a storage device 52, a coil control circuit 54, a control circuit 56, and a signal acquiring circuit 58. The control computer 50 acquires writing data from the storage device 52, performs multiple stages of data conversion processing on the writing data to generate shot data specific to the apparatus, and outputs the generated shot data to the control circuit 56. For example, the dose (amount of irradiation) and the coordinates of the irradiation position of each shot are defined in the shot data.

The control circuit 56 controls each part of the writer W to perform writing processing. For example, the control circuit 56 determines irradiation time t by dividing the dose of each shot by a current density, and applies a deflection voltage to the corresponding blankers of the blanking aperture array 10 such that beams are ON for the irradiation time t during the shot.

Also, the control circuit 56 computes the amount of deflection such that each beam is deflected to the position (coordinates) indicated by the shot data, and applies a deflection voltage to the deflector 18. Thus, multiple beams to be shot at the same time are deflected together.

In the alignment mechanism 40, the alignment coil 44 performs adjustment such that the electron beam 30 is perpendicularly incident on the aperture member 48. If the angle of incidence of the electron beam 30 on the aperture member 48 is not well adjusted, the electron beam 30 may not be able to illuminate all the holes 80 of the shaping aperture array 8, and the multiple beams (beam array) applied to the substrate 24 may be partially lost.

Accordingly, the present embodiment calculates a feature quantity representing the perpendicularity of the angle of incidence of the electron beam 30 on the aperture member 48, and adjusts the optical axis on the basis of the calculated feature quantity.

Figure 3A:
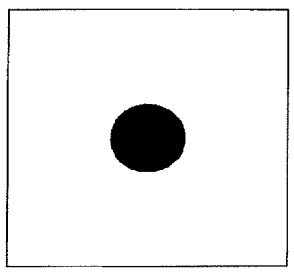
FIGS. 3A to 3C each illustrate an alignment scan image.
Figure 3B:
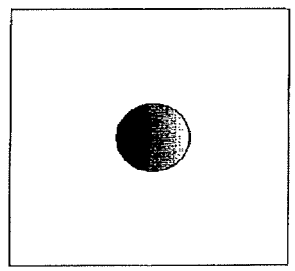

In the writing apparatus, the control computer 50 acquires a detection value of the detector of the aperture member 48 through the signal acquiring circuit 58, and generates an alignment scan image that visualizes the passage of the electron beam 30 through the hole of the aperture member 48. When the electron beam 30 is substantially perpendicularly incident on the aperture member 48, the brightness of a portion of the alignment scan image corresponding to the hole of the aperture member 48 is substantially uniformly distributed in a circular shape, as illustrated in FIG. 3A. On the other hand, when the perpendicularity of the angle of incidence of the electron beam 30 is small, the brightness distribution in the portion corresponding to the hole of the aperture member 48 is nonuniform, as illustrated in FIG. 3B.

Figure 3C:
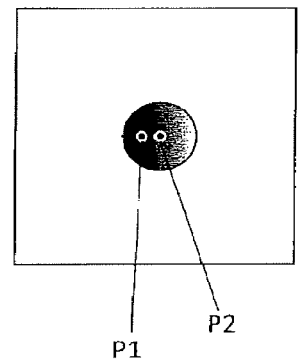

By focusing on this feature, in the present embodiment, the feature quantity calculating unit 51 of the control computer 50 calculates, as a feature quantity representing the uniformity of brightness, the amount of misalignment between the center of gravity of the brightness (density) of an acquired alignment scan image and the center of the alignment scan image. For example, in the alignment scan image illustrated in FIG. 3A, the center of brightness substantially coincides with the center of the alignment scan image, and the amount of misalignment is very small. FIG. 3C is a diagram obtained by adding the center of gravity of brightness P1 and the center of alignment scan image P2 to the alignment scan image illustrated in FIG. 3B. FIG. 3C shows that when the perpendicularity of the angle of incidence of the electron beam 30 is small, the amount of misalignment between the center of gravity of brightness P1 and the center of alignment scan image P2 is large.

Figure 4:
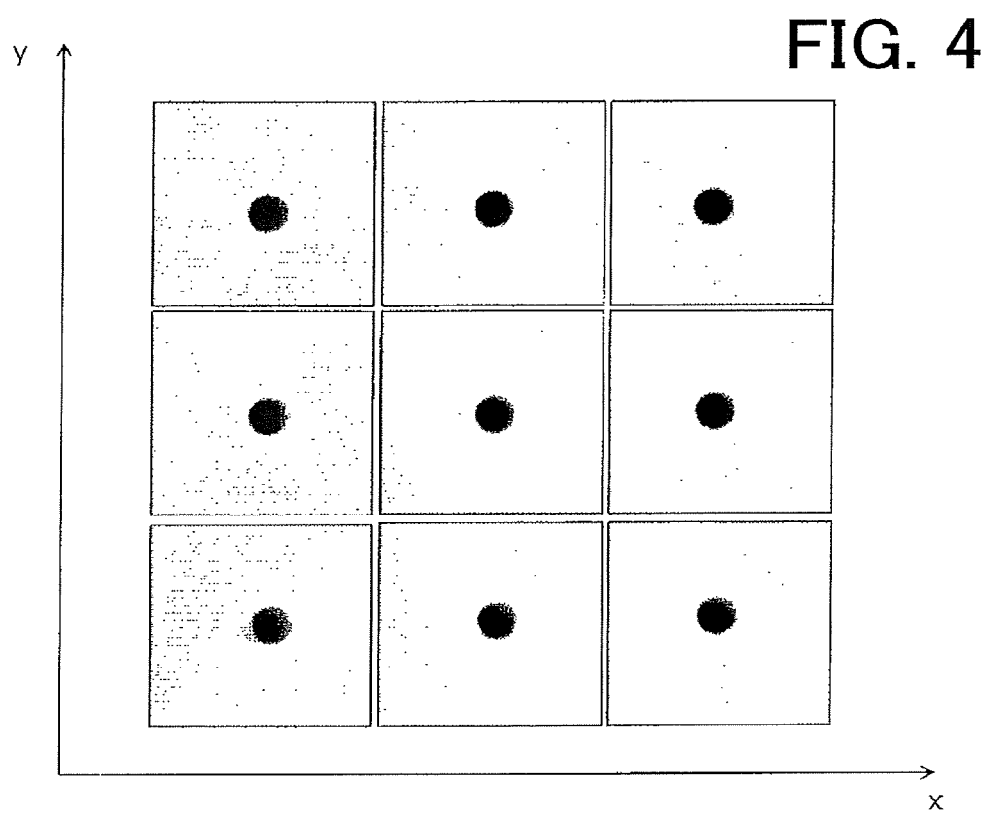
FIG. 4 illustrates an alignment scan image at each coil value.
Figure 5:
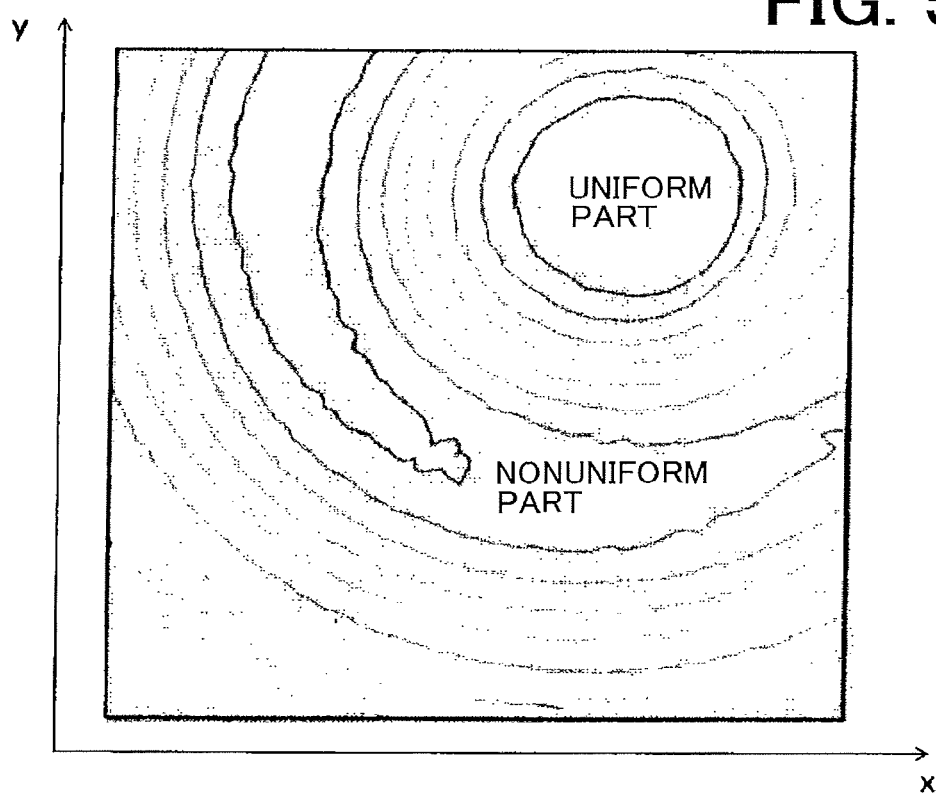
FIG. 5 shows contour lines representing changes in feature quantity (brightness uniformity).

By varying the excitation value (coil value) of the alignment coil 44, the tilt of the optical axis of the electron beam can be adjusted in a first direction and a second direction (e.g., in the x direction and the y direction) orthogonal to each other in a horizontal plane. FIG. 4 illustrates an alignment scan image at each coil value obtained by varying the direction of the optical axis in the x direction and the y direction. In the example of FIG. 4, the brightness of an alignment scan image in the upper right corner is most uniformly distributed. FIG. 5 shows contour lines representing changes in feature quantity obtained by varying the direction of the optical axis in the x direction and the y direction.

In the adjustment of the optical axis, first the feature quantity calculating unit 51 calculates a feature quantity (first feature quantity) in the current setting. Next, the coil control circuit 54 controls the coil value to change the direction of the optical axis in the x direction by a given amount, and the feature quantity calculating unit 51 calculates a feature quantity (second feature quantity) to determine the amount of change in feature quantity (i.e., a difference between the first feature quantity and the second feature quantity).

Next, the coil control circuit 54 controls the coil value to change the direction of the optical axis in the y direction by a given amount, and the feature quantity calculating unit 51 calculates a feature quantity (third feature quantity) to determine the amount of change in feature quantity (i.e., a difference between the second feature quantity and the third feature quantity).

The feature quantity calculating unit 51 determines the amount of change in coil value from the amount of change in feature quantity, and sends the determined amount of change to the coil control circuit 54. The coil control circuit 54 controls the coil value of the alignment coil 44 on the basis of the amount of change received. For example, when the feature quantity increases, the feature quantity calculating unit 51 changes the direction of the optical axis in an opposite direction. The feature quantity calculating unit 51 determines the amount of change in coil value in proportion to the amount of change in feature quantity.

The calculation of the feature quantity and the control of the coil value are repeated until the amount of change in feature quantity is below a predetermined value or the feature quantity is below a predetermined value. The adjustment can thus be made such that the feature quantity is reduced, or such that the center of the alignment scan image substantially coincides with the center of gravity of brightness and the electron beam 30 is perpendicularly incident on the aperture member 48.

As described above, the present embodiment calculates a feature quantity representing the uniformity of the brightness of an alignment scan image formed through the aperture member 48, and adjusts the optical axis on the basis of the feature quantity. The optical axis can thus be accurately adjusted such that the electron beam 30 is perpendicularly incident on the aperture member 48. This prevents a beam array applied to the substrate 24 from being lost, and improves the accuracy of writing.

Although the feature quantity represents the uniformity of brightness of the alignment scan image in the embodiment described above, the feature quantity is not limited to this. For example, the feature quantity may represent the area of the alignment scan image (i.e., the area of a region with a density higher than a given value in the alignment scan image).

Figure 6:
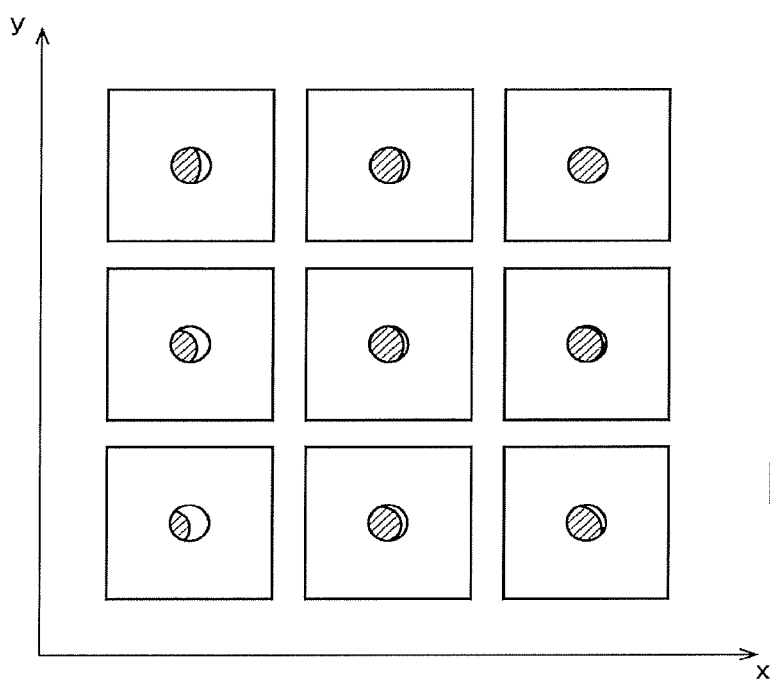
FIG. 6 is a schematic diagram illustrating the area of an alignment scan image at each coil value.

For example, the area in each alignment scan image shown in FIG. 4 is represented by a corresponding shaded portion in FIG. 6. The area is large when the electron beam 30 is substantially perpendicularly incident on the aperture member 48, whereas the area is small when the perpendicularity of the angle of incidence of the electron beam 30 is small.

As in the embodiment described above, in the adjustment of the optical axis, the calculation of the feature quantity (area) and the control of the coil value are repeated until the amount of change in feature quantity is below a predetermined value or the feature quantity exceeds a predetermined value. The adjustment can thus be made such that the area of the alignment scan image is increased and the electron beam 30 is perpendicularly incident on the aperture member 48.

Alternatively, the feature quantity may represent the brightness of the alignment scan image (i.e., the sum of brightness values of regions with densities higher than a given value in the alignment scan image).

At least part of the control computer 50 including the feature quantity calculating unit 51 described in the above embodiments may be implemented in either hardware or software. When implemented in software, a program that realizes at least part of functions of the control computer 50 may be stored on a recording medium such as a flexible disk or CD-ROM and read and executed by a computer. The recording medium is not limited to a removable recording medium such as a magnetic disk or optical disk, but may be a non-removable recording medium such as a hard disk device or memory.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A multi charged particle beam writing apparatus comprising:
    an emitter emitting a charged particle beam;
    a shaping aperture array including a plurality of opening portions and forming multiple beams by allowing the charged particle beam to pass through the plurality of opening portions:
    a blanking aperture array including a plurality of blankers each configured to perform
blanking deflection of a corresponding beam of the multiple beams;
    a stage holding a substrate thereon, the substrate being irradiated with the multiple beams;
    an alignment unit disposed between the emitter and the shaping aperture array, the alignment unit including an aperture plate, a detector provided in the aperture plate and detecting charged particles, and an alignment coil adjusting an angle of incidence of the charged particle beam on the aperture plate; and circuitry configured to
- generate an alignment scan image which visualizes a passage of the charged particle beam through a hole of the aperture plate based on a detection value of the detector and calculate a feature quantity representing a perpendicularity of the angle of incidence of the charged particle beam on the aperture plate; and
- control an excitation value of the alignment coil based on the feature quantity;

wherein the circuitry calculates, as the feature quantity, a value representing uniformity of brightness of the alignment scan image.

2. The multi charged particle beam writing apparatus according to claim 1, wherein the circuitry
- calculates, as the feature quantity, an amount of misalignment between a center of gravity of the brightness of the alignment scan image and a center of the alignment scan image; and
- controls the excitation value of the alignment coil such that the amount of misalignment is reduced.

3. An adjusting method for a multi charged particle beam writing apparatus, the adjusting method comprising;
- emitting a charged particle beam;
- allowing the charged particle beam to pass through an aperture plate;
- forming multiple beams by allowing the charged particle beam passed through the aperture plate to pass through a plurality of opening portions of a shaping aperture array;
- irradiating a substrate on a stage with the multiple beams;
- generating an alignment scan image which visualizes a passage of the charged particle beam through a hole of the aperture plate based on charged particles detected by a detector provided in the aperture plate;
- calculating, from the alignment scan image, a feature quantity representing a
- perpendicularity of an angle of incidence of the charged particle beam on the aperture plate; and
    - adjusting the angle of incidence of the charged particle beam on the aperture plate based on the feature quantity;
- wherein a value representing uniformity of brightness of the alignment scan image is calculated as the feature quantity.

4. The adjusting method for a multi charged particle beam writing apparatus according to claim 3, wherein an amount of misalignment between a center of gravity of the brightness of the alignment scan image and a center of the alignment scan image is calculated as the feature quantity; and
- an excitation value of an alignment coil is controlled such that the amount of misalignment is reduced.

* * * * *